United States Patent
Endo et al.

(10) Patent No.: US 8,207,767 B2
(45) Date of Patent: Jun. 26, 2012

(54) ADPLL CIRCUIT, SEMICONDUCTOR DEVICE, AND PORTABLE INFORMATION DEVICE

(75) Inventors: Ryo Endo, Kanagawa (JP); Jiro Shimbo, Kanagawa (JP); Tomomitsu Kitamura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 29 days.

(21) Appl. No.: 12/955,192

(22) Filed: Nov. 29, 2010

(65) Prior Publication Data
US 2011/0140747 A1 Jun. 16, 2011

(30) Foreign Application Priority Data
Dec. 16, 2009 (JP) ................................. 2009-284765

(51) Int. Cl.
*H03L 7/06* (2006.01)
(52) U.S. Cl. ........................................ 327/156; 327/159
(58) Field of Classification Search .................... None
See application file for complete search history.

(56) References Cited

U.S. PATENT DOCUMENTS
7,123,102 B2* 10/2006 Uozumi et al. ................. 331/34
7,301,416 B2* 11/2007 Yamamoto et al. ........... 331/179
2005/0068119 A1 3/2005 Uozumi et al.

FOREIGN PATENT DOCUMENTS
JP 2005-109618 A 4/2005
* cited by examiner

*Primary Examiner* — Cassandra Cox
(74) *Attorney, Agent, or Firm* — Mattingly & Malur, P.C.

(57) ABSTRACT

The present invention provides ABS precision improving means under ADPLL environment or environment close to the ADPLL environment and realizes shortening of process time of the ABS. In a digital frequency comparator in an ABS circuit, a DFF for storing an initial phase difference in a DPE signal output from a DPFD is prepared. Immediately after start of ABS operation, a DPE signal output from the DPFD is recorded as a signal expressing an initial phase difference in an internal circuit of the DPFD into the DFF. After that, the digital frequency comparator performs ABS by using a signal obtained by subtracting the initial phase error recorded in the DFF from an input DPE signal, thereby realizing high-speed and stabilized ABS operation.

13 Claims, 10 Drawing Sheets

ADPLL CIRCUIT, SEMICONDUCTOR DEVICE, AND PORTABLE INFORMATION DEVICE

CROSS-REFERENCE TO RELATED APPLICATIONS

The disclosure of Japanese Patent Application No. 2009-284765 filed on Dec. 16, 2009 including the specification, drawings and abstract is incorporated herein by reference in its entirety.

BACKGROUND OF THE INVENTION

The present invention relates to a circuit configuration of ABS (Auto Band Select) mainly used for a wireless transmitter/receiver or the like and, more particularly, to the configuration of a PLL (Phase Lock Loop).

The ABS function is an indispensable technical element for a configuration of a wireless transmitter/receiver of recent years. Cellular phones each using the wireless transmitter/receiver are generally adapted to a tri-band or dual-band of, for example, 800 MHz, 900 MHz, and 2 GHz.

Shortening of process time of the ABS function is synonymous with increase in speed of phase locking of a PLL. Therefore, it is important to increase the speed of phase locking of a PLL.

In the invention described in Japanese Unexamined Patent Publication No. 2005-109618 (patent document 1), a method of determining a final selection band is disclosed, by employing a binary search method for a PLL of an open loop method and performing phase determination by the number of times according to the number of band switch control signals input to a VCO.

Since precision of ABS and process time have a tradeoff relation, to shorten the process time of the ABS, high-precision ABS is required. To realize high-precision ABS, in recent years, a method using a DPFD (Digital Phase Comparator) is becoming common.

Further, it is also considered to increase precision of a PLL by using an ADPLL (All Digital Phase Lock Loop) in which all of circuit configurations are digitized and to configure a wireless transmitter/receiver by a general semiconductor manufacturing process.
Patent Document 1: Japanese Unexamined Patent Publication No. 2005-109618

SUMMARY OF THE INVENTION

The invention described in the patent document 1, however, relates to a conventional analog PLL and cannot be applied to an ADPLL.

In the DPFD, an initial value (analog amount) of an input phase difference caused by device delay exists inevitably. When the value is large, the initial value of the ABS is not taken, and it causes a functional trouble.

Further, a problem related to the initial value of output digital data of the DPFD also exists. Since an output of the DPFD is digital data, on the data, an input phase difference can be completely set to "0". In the ABS using the DPFD, a change in the phase is read by using the output of the DPFD. When the input phase differences are accumulated, it is also considered as an inconvenience at the time of performing a saturation process on the DPFD.

An object of the present invention is to provide ABS precision improving means under ADPLL environment or environment close to the ADPLL environment and to realize shortening of process time of the ABS.

In addition, means for preventing occurrence of saturation by providing means for performing ABS process without accumulating an input phase difference is provided.

The above and other objects and novel features of the present invention will become apparent from the description of the specification and appended drawings.

Outline of representative ones of inventions disclosed in the application will be briefly described as follows.

An ADPLL circuit related to a representative embodiment of the invention includes a digitally controlled oscillator, a digital phase comparator for detecting a phase error between a frequency division signal obtained by dividing frequency of an output of the digitally controlled oscillator and a reference signal, and an ABS circuit for performing automatic frequency selection. The ABC circuit has therein a digital frequency comparator for detecting a shift direction of a phase error between the frequency division signal and the reference signal from an output of the digital frequency comparator, and the digital frequency comparator includes a first D-flip flop for storing a shift amount of the phase error between the frequency division signal and the reference signal in beginning of start of the ABS operation of the digital phase comparator.

In the ADPLL circuit, the digital frequency comparator may have a subtractor for subtracting the shift amount of the phase error stored in the first D-flip flop from an output of the digital phase comparator which is input.

In the ADPLL circuit, the digital frequency comparator may detect a shift direction of the phase error by using sign of a value obtained by subtracting the shift amount of the phase error stored in the first D-flip flop from the output of the digital phase comparator.

In the ADPLL circuit, the ABS circuit may further include a binary search device, a band signal configured by two or more signal lines is output from the binary search device, and a value of any one of the signal lines of the band signal is determined by supplying a shift direction of the phase error to the binary search device.

The ADPLL circuit may further include a digital low-pass filter, and the band signal and an output of the digital phase comparator via the digital low-pass filter may be input to the digitally controlled oscillator.

The ADPLL circuit may further include an analog phase comparator and a selector circuit, and the selector circuit may select which one of an output of the digital phase comparator and an output of the analog phase comparator is input to the binary search device.

A semiconductor device having any of the ADPLL circuits and a portable information device including the semiconductor device are also included in the scope of the present invention.

An effect obtained by a representative one of inventions disclosed in the application will be briefly described as follows.

By using an ABS circuit related to a representative embodiment of the present invention, an initial frequency error of a TDC (Time to Digital Converter) used in an ADPLL and a DPFD including the TDC can be digitally cancelled. It can contribute to improve the precision of ABS and increase speed of frequency locking.

DETAILED DESCRIPTION OF THE PREFERRED EMBODIMENTS

Embodiments of the present invention will be described below with reference to the drawings.

First Embodiment

Figure 1:
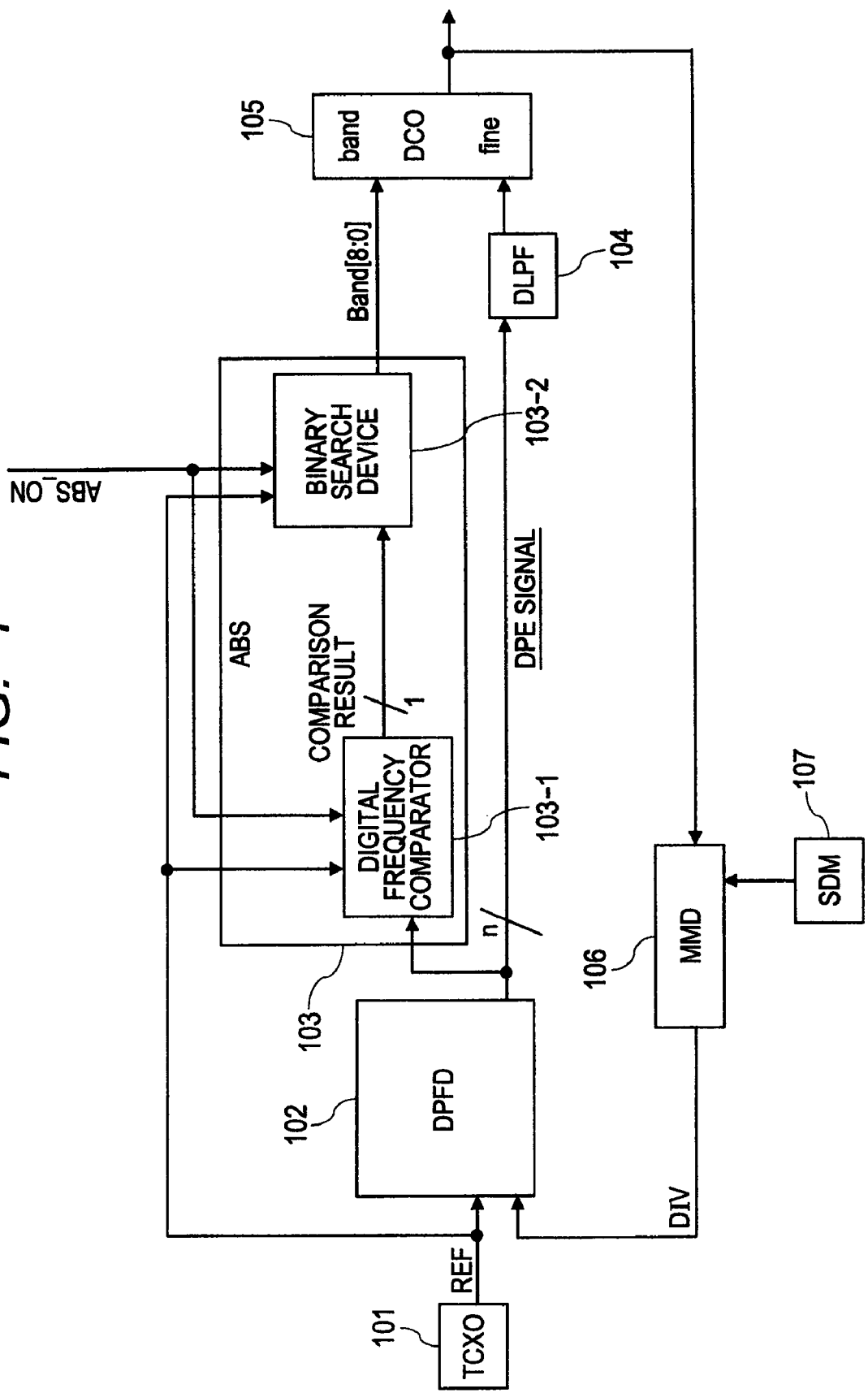
FIG. 1 is a block diagram showing the configuration of an ADPLL circuit for a cellular phone related to a first embodiment of the present invention.

FIG. 1 is a block diagram showing the configuration of an ADPLL circuit for a cellular phone related to a first embodiment of the present invention.

The ADPLL circuit includes a TCXO 101, a DPFD 102, an ABS circuit 103, a DLPF 104, a DCO 105, an MMD 106, and an SDM 107.

The TCXO 101 is a reference frequency oscillation circuit of a temperature compensation type that outputs an REF signal as a reference frequency signal. The REF signal is supplied to the DPFD 102 and a binary search device 103-2 (which will be described later) in the ABS circuit 103.

The DPFD (Digital Phase Frequency Detector) 102 is a phase difference detecting circuit for detecting the phase difference between the REF signal input from the TCXO 101 and a DIV signal (which will be described later) input from the MMD 106. The DPFD 102 often includes a counter for detecting a rough deviation between two signals on the REF signal unit basis and a TDC (Time to Digital Converter) for deriving the difference smaller than the REF signal.

The phase difference derived by the DPFD 102 is input as a DPE signal as a digital value to the ABS 103 and the DLPF 104. In the embodiment, the DPE signal is a signal having a bid width of n bits (an integer satisfying n>1)

The ABS (Auto Band Selection) circuit 103 is a frequency band selection circuit for determining frequency using, as a reference, a frequency which is set in advance.

The ABS circuit 103 includes a digital frequency comparator 103-1 and the binary search device 103-2.

Figure 2:
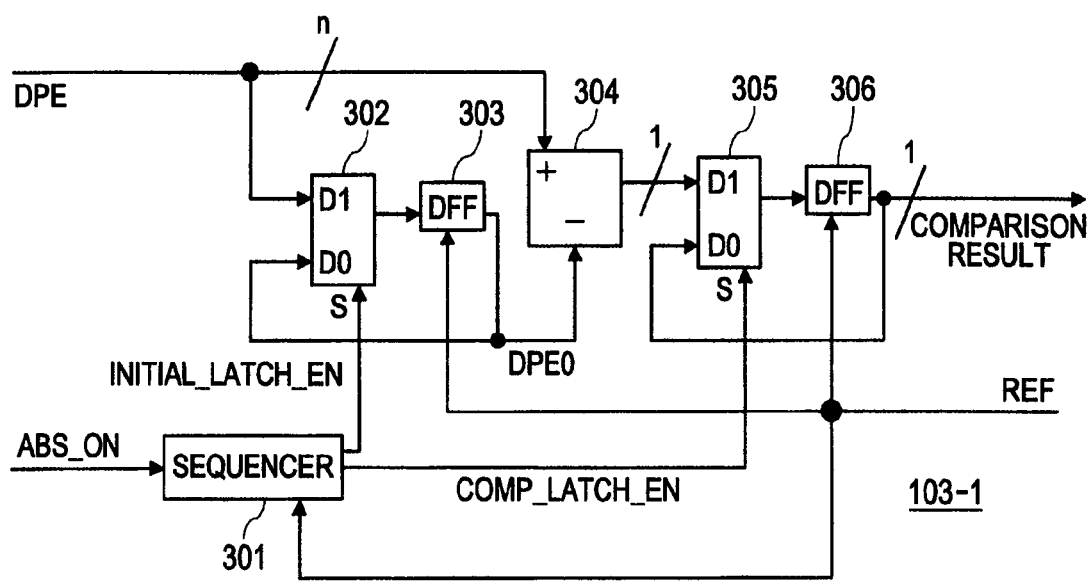
FIG. 2 is a block diagram showing the configuration of a digital frequency comparator related to the first embodiment of the invention.

The digital frequency comparator 103-1 is a module for absorbing a shift in the initial phase and a phase variation from an output of the DPFD 102. FIG. 2 is a block diagram showing the configuration of the digital frequency comparator 103-1 related to the first embodiment of the invention.

The digital frequency comparator 103-1 includes a sequencer 301, a first selector 302, a first DFF 303, subtractor 304, a second selector 305, and a second DFF 306.

The sequencer 301 is a control circuit for generating an operation timing of each selector.

To the sequencer 301, an ABS_ON signal and a REF signal are input. The ABS_ON signal is output from a main sequencer (not shown in FIG. 3) as a control circuit on the high-order side instructing start of automatic frequency setting at the power-on or the like. The REF signal is a reference frequency input from the TCXO 101. As stated also in the description of the TCXO 101, the signal is temperature-compensated, so that the reliability against temperature changes is high. The sequencer 301 operates on the basis of the ABS_ON signal and the REF signal.

As output signals of the sequencer 301, an INITIAL_LATCH_EN signal and a COMP_LATCH_EN signal exist.

The ABS_ON signal input to the sequencer 301 is at the "H" level on start of comparison of each bit and becomes the "L" level at the time of completion. By repeating the operation only by the number of output signal lines of the binary search device 103-2, the ABS operation is finished.

Using the rising edge of the REF signal subsequent to the rise of the ABS_ON signal as a timing, the INITIAL_LATCH_EN signal rises. The trailing timing of the INITIAL_LATCH_EN signal matches the rising edge of the REF signal after the rise of the INITIAL_LATCH_EN signal.

A down counter in the sequencer 301 is reset at the rising edge of the ABS_ON signal and starts down-counting. When the down counter becomes zero, the COMP_LATCH_EN signal becomes the "H" level. When the signal is at the "H" level, the second DFF 306 holds the value of the second selector 305 using an output of the subtractor 304 as a comparison result. The trailing timing of the COMP_LATCH_EN signal matches the next rising edge of the REF signal after the rising of the COMP_LATCH_EN signal.

The first selector 302 is a selector circuit for determining whether a DPE signal as an output value of the DPFD 102 is output to the first DFF 303 or not and whether the output value of the first DFF 303 is fed back or not.

To the first selector 302, the INITIAL_LATCH_EN signal is input. When the INITIAL_LATCH_EN signal is at the "H" level, the value of the DPE signal is output from the first selector 302. When the INITIAL_LATCH_EN signal is at the "L" level, the value of the first DFF 303 is output from the first selector 302.

The first DFF (D-Flip Flop) 303 is a group of D-flip flops for holding an output of the first selector 302. The first DFF 303 is configured by D-flip flops of the number corresponding to the number of bits (n in FIG. 2, (n>0 and n is an integer)) of the DPE.

To the first DFF 303, the REF signal is input as a timing.

When the REF signal changes from "L" to "H", the first DFF 303 latches an output signal from the first selector 302 supplied. As a result, the first selector 302 can hold the value of the "initial phase difference" shown in FIG. 3 (which will be described later). The output signal of the DFF 303 is expressed as DPE0.

The subtractor 304 subtracts the value (DPE0) of the "initial phase difference" stored in the first DFF 303 from the output value (DPE signal) of the DPFD 102 which is supplied.

When the value (DPE0) of the "initial phase difference" is subtracted from the input DPE signal, the sign becomes either "+" or "−". The subtractor 304 outputs only the sign to the second selector 305. The sign expresses "a phase shift direction" indicative of whether the REF signal is ahead of the DIV signal or the DIV signal is ahead of the REF signal.

Therefore, the output of the subtractor 304 is made of one bit. It enables the ABS operation to be performed with frequency information obtained by cancelling out the initial phase difference.

The second selector 305 is a selector circuit for determining whether or not an output signal of the subtractor 304 is output to the second DFF 306 and whether or not the value of the second DFF 306 is fed to the second DFF 306 itself.

To the second selector 305, the COMP_LATCH_EN signal is input. When the COMP_LATCH_EN signal is at the "H" level, the second selector 305 outputs the output signal of the subtractor 304 to the second DFF 306. When the COMP_LATCH_EN signal is at the "L" level, the second selector 305 outputs the output itself of the second DFF 306 to the second DFF 306.

The second DFF 306 is a D-flip flop for holding the "sign" of the DPE signal from which the "initial phase difference" is subtracted. The REF signal is input also to the second DFF 306, and data of the second DFF 306 is updated by the rising edge of the REF signal.

As described above, the second DFF 306 holds the "sign" of the DPE signal from which the "initial phase difference" is subtracted. Therefore, different from the first DFF 303, the second DFF 306 is always configured by a D-flip flop of one bit.

When the REF signal changes from "L" to "H", the second DFF 306 latches an output of the second selector 305. By the operation, the "sign" of the phase difference between the DIV signal and the REF signal can be derived by the DPE signal from which the value of the "initial phase difference" is subtracted. The output of the second DFF 306 is output as the comparison result to the binary search device 103-2.

By latching the value (DPE0) of the "initial phase difference" and subtracting the value of the "initial phase difference" from the input DPE, the comparison result, which is input to the binary search device 103-2, can be stabilized early. Consequently, stability in the rising period of the ABS_ON signal and, further, in the entire ABS operation can be obtained early.

Figure 3:
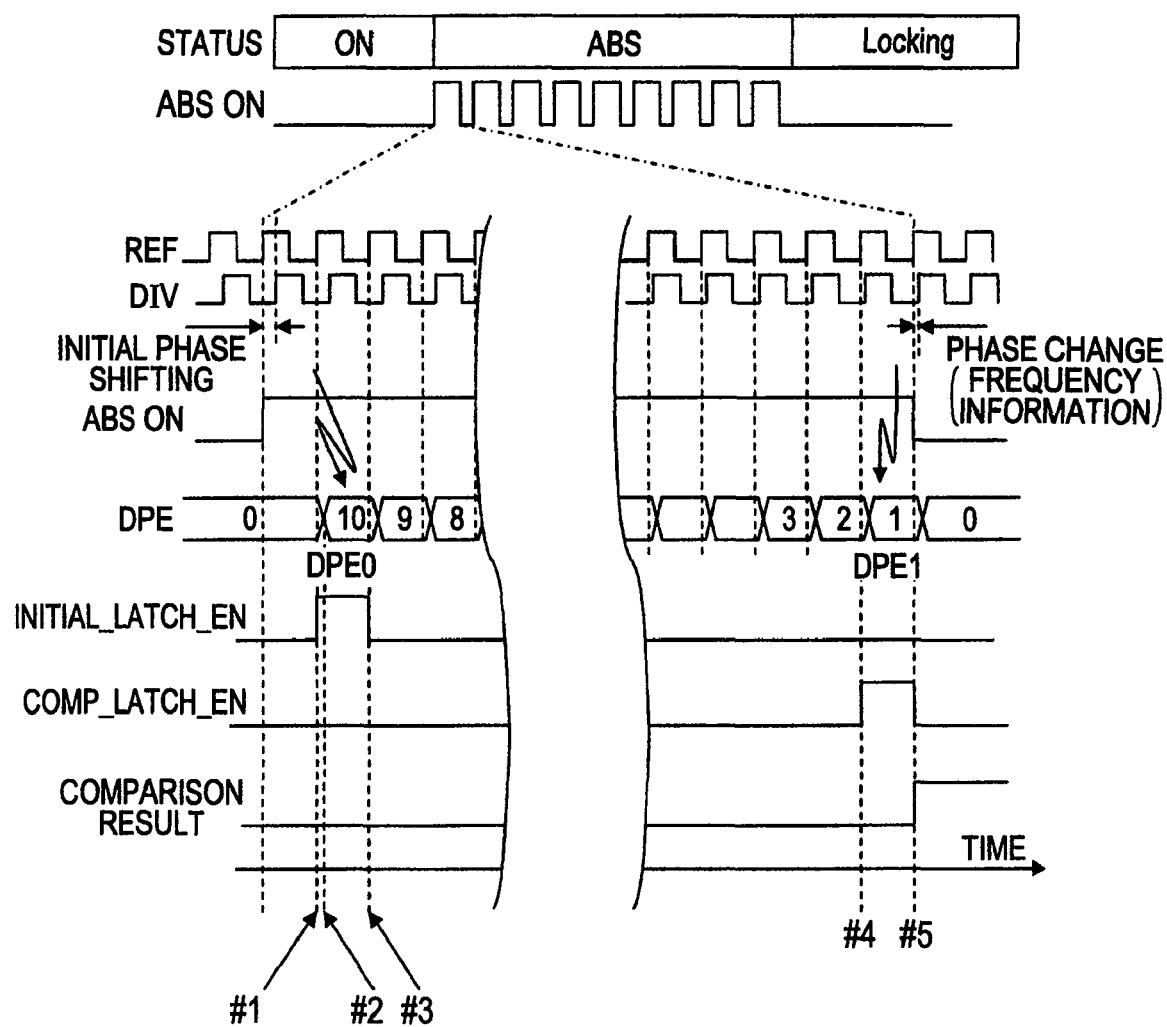
FIG. 3 is a timing chart showing the operation of the digital frequency comparator related to the first embodiment of the invention.

FIG. 3 is a timing chart showing the operation of the digital frequency comparator 103-1 related to the first embodiment of the invention. Using the diagram, the operation of the digital frequency comparator 103-1 will be described.

In the embodiment, entire operations of the ADPLL include 1) power on (ON), 2) ABS process (ABS), and 3) frequency lock (locking). In FIG. 3, the status in the uppermost stage indicates the operations.

Among the operations, 2) ABS process is directly related to the present invention. During the ABS process period, the ABS_ON signal is input nine times by a not-shown main sequencer. The number of input times of the ABS_ON signal depends on the number of band signals to be adjusted (signals output from the binary search device 103-2 to the DCO 105). Therefore, when the number of band signals increases, the number of input times of the ABS_ON signal increases. When the number of band signals decreases, the number of input times of the ABS_ON signal also decreases.

By the input of the ABS_ON signal of once, the status of the band signal is determined. The entire process will be described later with reference to FIG. 5 and, now, how the digital frequency comparator 103-1 operates when the ABS_ON signal is input once will be described.

As described above, at the rising edge of the REF signal immediately after the ABS_ON signal is input, the sequencer 301 rises the INITIAL_LATCH_EN signal (#1 in FIG. 3). When this state is obtained, the first selector 302 outputs the DPE signal to the first DFF 303.

When the ABS_ON signal of the "H" level is input, the DPFD 102 also starts operating simultaneously with the ABS circuit 103. Since the DPFD 102 also operates in response to the REF signal output from the TCXO 101, after a period of time since the ABS_ON signal of the "H" level is input, the difference between the DIV signal and the REF signal is reflected in the DPE signal as an output of the DPFD 102, and the resultant DPE signal is output (#2 in FIG. 3).

When the REF signal rises during the period in which the DPE signal is input, the first DFF 303 holds the DPE signal (#3 in FIG. 3). Since then, even after the INITIAL_LATCH_EN signal becomes the "L" level, the initial value of the DPE (initial phase difference) held in the first DFF 303 is continuously held. The initial phase difference corresponds to a device delay in the DPFD 102. By cancelling out the device delay by the subtractor 304, high-precision ABS operation can be performed. All of data between the DFFs is designed so that no timing violation in setup/hold and the like occurs by a logic synthesis tool.

The subtractor 304 subtracts the value held in the first DFF 303 from the DPE signal as an output of the DPFD 102 without being influenced by the external circuits. When the initial value of the DPE held in the first DFF 303 is held, the initial phase difference is subtracted from the DPE signal as an output of the DPFD 102.

After reference time (step S1005 in FIG. 5 which will be described later) elapses, the sequencer 301 sets the COMP_LATCH_EN signal to the high level at the rising edge of the REF signal (#4 in FIG. 3). Consequently, the second selector 305 supplies the sign of the signal obtained by subtracting the initial phase difference from the DPE signal to the second DFF 306. At the rising edge of the next REF signal, the sign is latched by the second DFF 306 (#5 in FIG. 3). By the sign, the comparison result supplied to the binary search device 103-2 is determined. In this case as well, all of data between the DFFs is designed so that no timing violation in setup/hold and the like occurs by a logic synthesis tool.

By repeating the input of the ABS_ON signal nine times, the values of nine band signals output from the binary search device 103-2 can be determined.

The binary search device 103-2 is a module for determining a band signal of nine bits supplied to the DCO 105 on the basis of a comparison result supplied from the digital frequency comparator 103-1.

Figure 4:
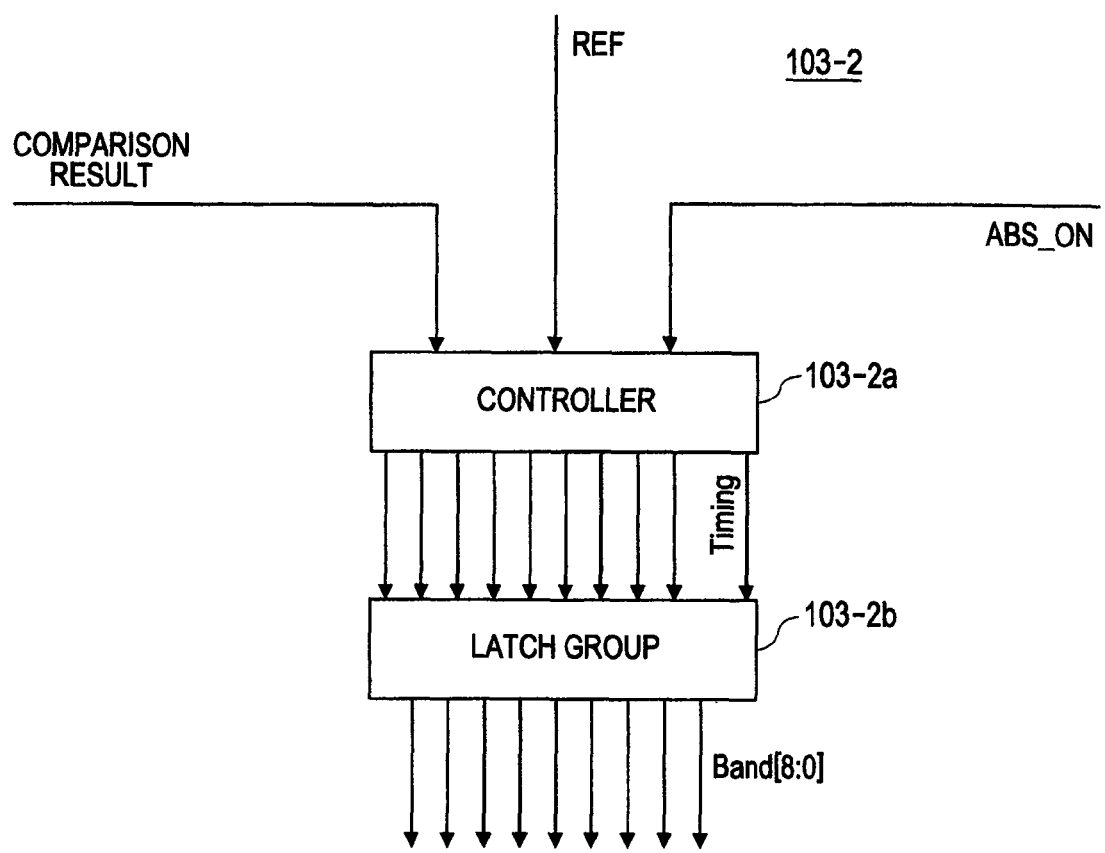
FIG. 4 is a block diagram showing the configuration of a binary search device related to the first embodiment of the invention.

FIG. 4 is a block diagram showing the configuration of the binary search device 103-2. As obvious also from the diagram, the binary search device 103-2 includes a controller 103-2a and a latch group 103-2b.

To the controller 103-2a, a comparison result input from the digital frequency comparator 103-1, the REF signal input from the TCXO 101, and the ABS_ON signal are supplied. By the controller 103-2a, a band signal input to the DCO 105 is determined. The controller 103-2a also outputs a timing signal for making a band signal output from itself latched by the latch group 103-2b.

The controller 103-2a detects the direction of a shift between the REF signal and the DIV signal on the basis of the comparison result supplied by the digital frequency comparator 103-1. When the comparison result is "1", it is regarded that REF<DIV is satisfied, and the controller 103-2a sets "0" in a band signal line to be processed. When the comparison result is "0", it is regarded that REF>DIV is satisfied, and the controller 103-2a sets "1" in the band signal line to be processed.

The latch group 103-2b is a latch group for stably holding the band signal output from the controller 103-2a. The latch group 103-2b exists to stabilize the operation of the DCO 105 by latching the band signal output from the controller 103-2a in response to the timing signal after the output from the controller 103-2a is stabilized. If the operation conditions of the DCO 105 allow, the latch group 103-2b may not be provided and the output of the controller 103-2a may be directly supplied to the DCO 105.

The DLPF 104 is a digital low-pass filter which is inserted to remove a high harmonic component in the difference between the REF signal and the DIV signal obtained by the DPFD 102.

The DCO 105 is a digitally controlled oscillator which operates on the basis of outputs of the ABS circuit 103 and the DPLF 104. In the embodiment, binary weight of the DCO 105 is determined by (nine) band signals output from the ABS circuit 103. Thermal weight of the DCO 105 is determined by the output of the DLPF 104.

The MMD 106 is a multi-module divider for dividing an output of the DCO 105. An output of the MMD 106 is a DIV signal. The DIV signal is compared with the REF signal as a reference operation clock in the DPFD 102.

The SDM 107 is a frequency division ratio setting module for determining the frequency division ratio of the MMD 106. The input value which is input to the SDM 107 is changed according to the required operation frequency and, accordingly, the value (frequency division ratio) input to the MMD 106 is determined.

The operation of the ADPLL having such a configuration will be described below.

Figure 5:
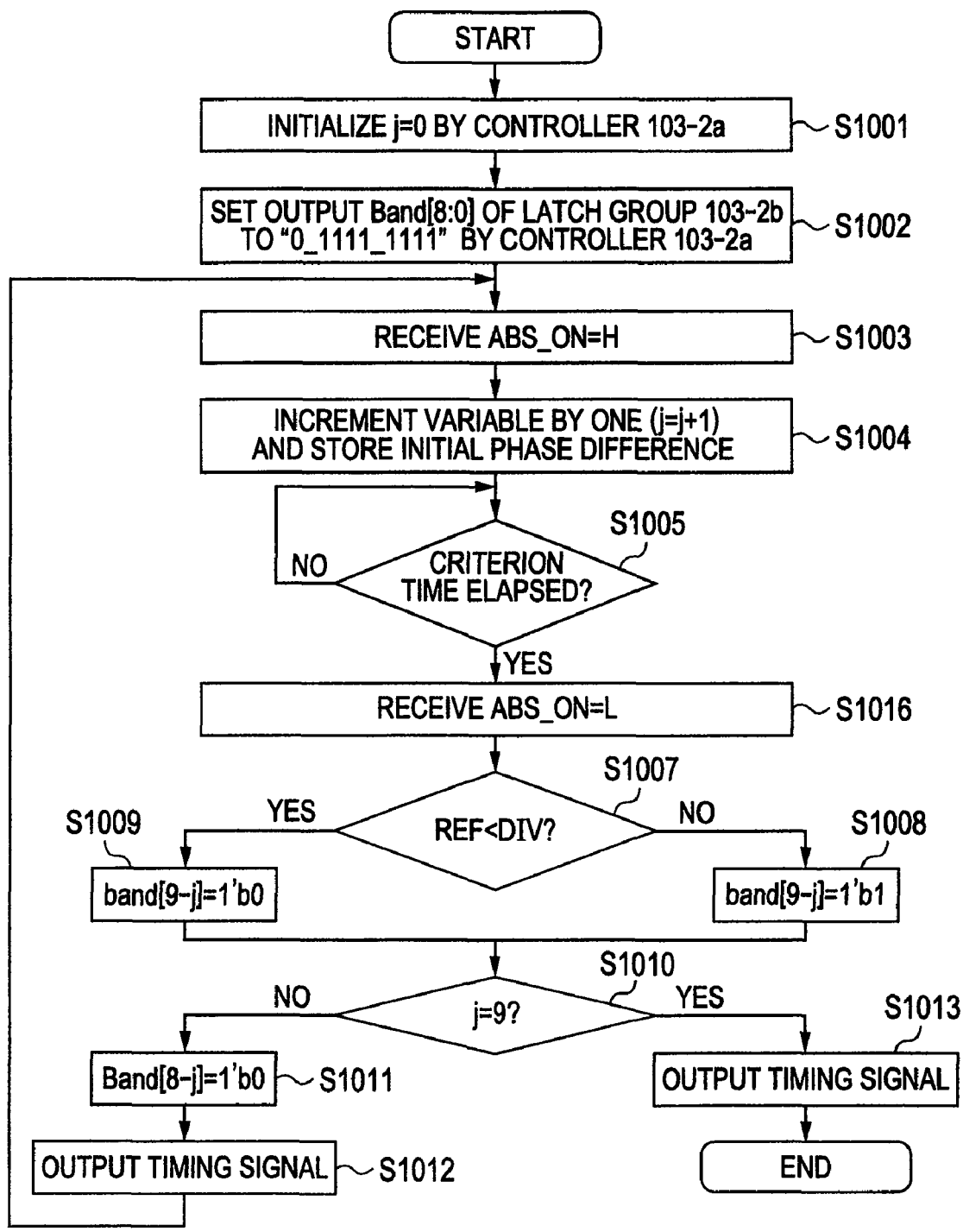
FIG. 5 is a flowchart for explaining the operation of an ABS circuit related to the first embodiment of the invention.

FIG. 5 is a flowchart for explaining the operation of the ABS circuit 103 related to the first embodiment of the invention.

First, on start of the initial operation such as power-on, the controller 103-2a initializes a variable "j" to 0 (step S1001). The variable "j" expresses what is the band signal to be controlled by the controller 103-2a is. By the variable "j", the number of input times of the ABS_ON signal is also stored. In the description of the embodiment, when the variable "j" is "1", the most significant band signal [8] is an object to be controlled. When the variable "j" is "9", the band signal [0] is an object to be controlled.

Next, in correspondence with the process in step S1001, the controller 103-2a sets the band signals [8:0] as outputs of the latch group 103-2b to "0_1111_1111" in binary representation (step S1002).

By setting such a value, the initial value can be set to an almost center of a frequency range which can be set in the ABS circuit 103. "0_1111_1111" in binary representation is just an example, and "1_0000_0000" may be also used. Another value may be set intentionally.

The above processes are performed immediately after startup and have to be performed before input of the ABS_ON signal.

After that, the ABS circuit 103 receives the ABS_ON signal of the "H" level from a not-shown main sequencer (step S1003). In response to the rising edge of the ABS_ON signal, the controller 103-2a increments the variable "j" by one. In response to the rising edge of the ABS_ON signal, the sequencer 301 rises the INITIAL_LATCH_EN signal to perform a process for storing the initial phase difference between the DIV signal and the REF signal into the first DFF 304 (step S1004).

After lapse of reference time (step S1005), the sequencer 301 rises the COMP_LATCH_EN signal and latches the output of the subtractor 304, that is, the result of comparison between a target frequency and a real frequency.

After that, the ABS circuit 103 receives the trailing edge of the ABS_ON signal (step S1006). By the reception, the ABS_ON process is finished, and the binary search device 103-2 refers to the comparison result input from the digital frequency comparator 103-1 (step S1007).

In the case where the referred comparison result is REF<DIV (Yes in step S1006), the controller 103-2a sets "0" to a signal line to be operated (step S1009). In the case where the referred comparison result is REF≧DIV (No in step S1006), the controller 103-2a sets "1" to a signal line to be operated (step S1008).

After the process on the band signal line in step S1007 or S1008 is finished, the controller 103-2a confirms whether the variable "j" is equal to 9 or not (step S1010).

When j=9 (Yes in step S1010), the ABS_ON signal is not input anymore. Therefore, the controller 103-2a outputs the timing signal (step S1013) and the ABS operation is finished.

On the other hand, when j is not equal to 9 (No in step S1010), after the band signal to be controlled on reception of the next ABS_ON signal is set to "0" (step S1011), the controller 103-2a outputs the timing signal to the latch group 103-2b (step S1012). By the operation, the frequency output from the DCO 105 is changed, and the binary search on frequency can be performed.

In the case where the initial value is set to "1_0000_0000" in step S1002, the set value in step S1011 becomes "1".

After completion of the process in step S1012, the program returns to the process in step S1003 and continues the process until step S1013.

Figure 6:
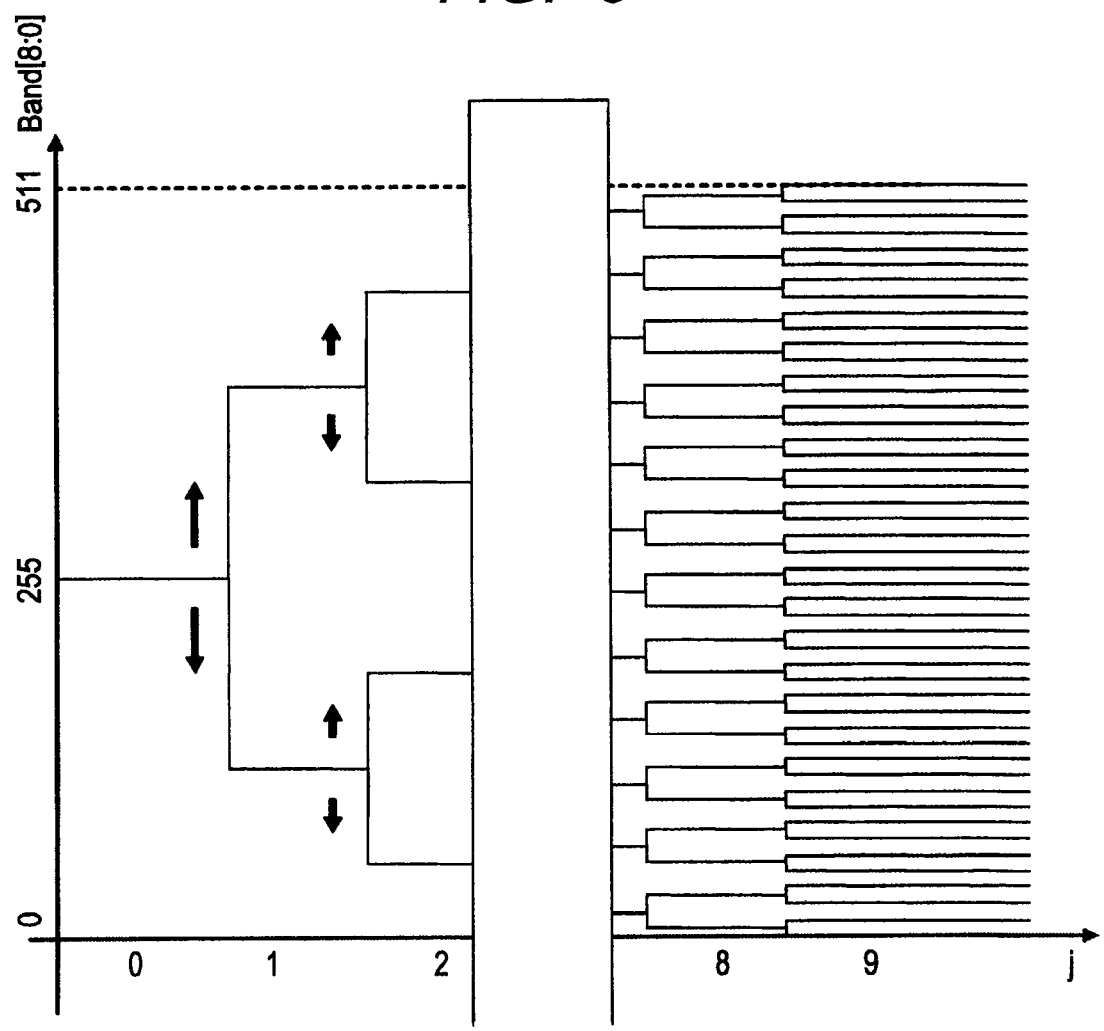
FIG. 6 is a conceptual diagram for explaining a binary search related to the first embodiment of the invention.

With such a configuration, the ABS operation by the binary search can be performed as shown in FIG. 6. FIG. 6 is a conceptual diagram for explaining the binary search related to the first embodiment of the invention.

The vertical axis in FIG. 6 indicates the frequency selected by the band signal. The horizontal axis of FIG. 6 indicates the number of input times of the ABS_ON signal.

As described above, in the embodiment, the band signal has a bit width of nine bits. Consequently, there is the possibility that the vertical axis has the values from "0" to "511". As also described in step S1002, the initial value of the band signal is "0_1111_1111", so that the value is 255, that is, the value is positioned in an almost center of the settable range.

Each time the ABS_ON signal is input, the relation (large or small) between the REF signal and the DIV signal is determined in step S1006. By performing the operation (as the value of "j" on the horizontal axis increases), the ABS operation can be performed at high speed.

Figure 7:
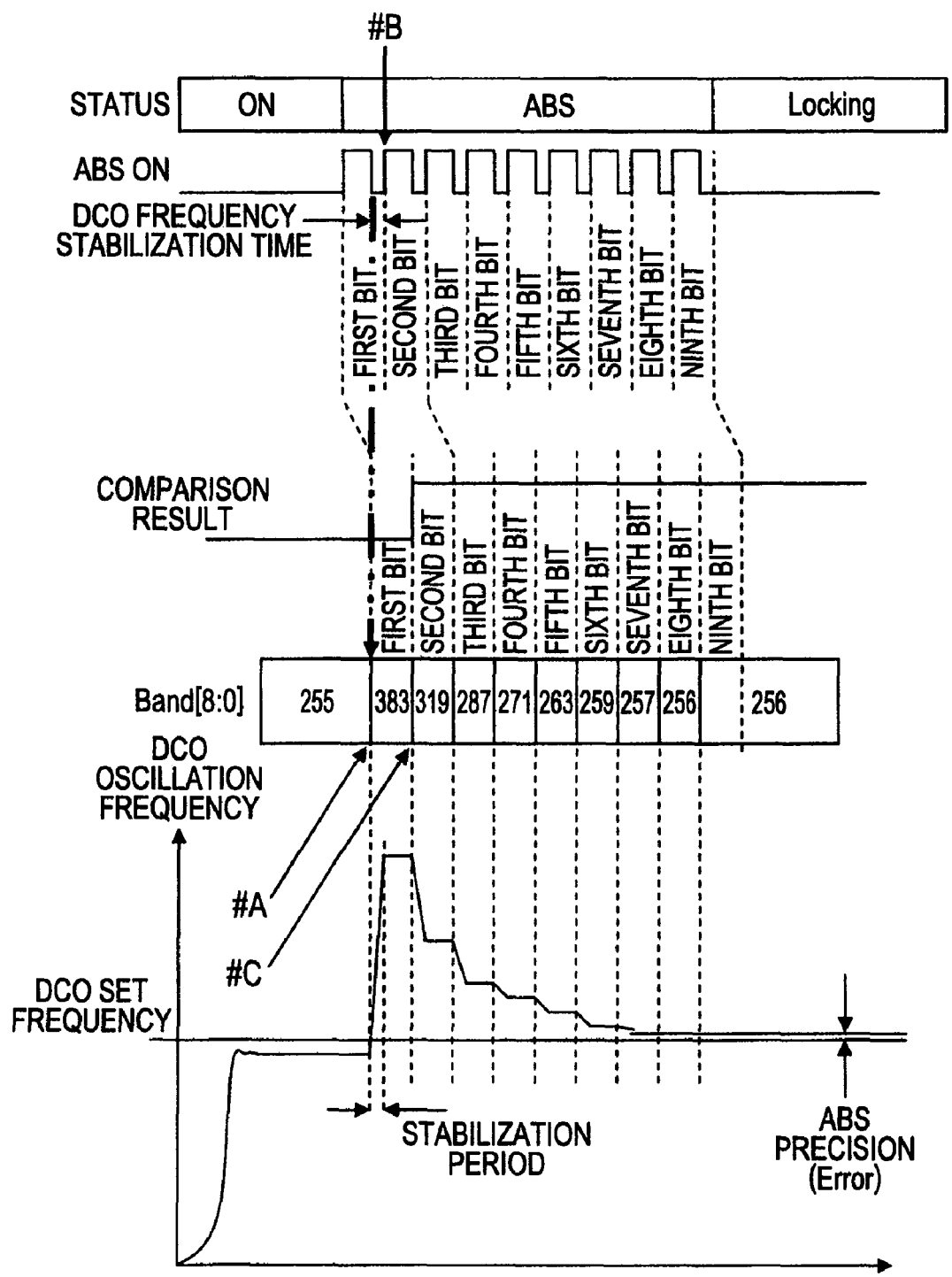
FIG. 7 is a timing chart expressing the entire operation of ABS process related to the first embodiment of the invention.

Finally, the flow of the entire ABS process (ABS) will be described. FIG. 7 is a timing chart expressing the entire operation of ABS process related to the first embodiment of the invention. It is assumed that the DCO set frequency in the diagram exists between 255 and 256 at the time of performing setting with the band [8:0].

In the timing chart, "status" and "ABS_ON signal" positioned at the upper stage are the same as "status" and "ABS_ON signal" at the upper stage of FIG. 3.

1) As described in step S1002, the band [8:0] output to the DCO 105 at power-on (ON) is set to "0_1111_1111" in binary representation. Therefore, the DCO oscillation frequency" at the lowest stage in FIG. 7, that is, an output of the DCO 105 is stabilized at the band [8:0]=255 ("0_1111_1111" in binary representation).

2) When the program moves to the ABS (ABS process), the ABS_ON signal of the "H" level is input to the ABS circuit 103 (step S1003 in FIG. 5). After that, the process until the ABS_ON signal of the "L" level is input to the ABS circuit 103 is as described with reference to FIG. 5.

The output of the timing signal in step S1011 in FIG. 5 is generated when the ABS_ON signal of the "L" level is input to the ABS circuit 103. Therefore, the value of the band [8:0] in the middle stage in FIG. 7 is updated using the rising edge of the ABS_ON signal as a trigger. Since the actual output of the DCO is lower than the DCO set frequency, the "comparison result" in the ABS circuit 103 becomes the "L" level (No in step S1007). Consequently, the value of the first bit is set to "1" (step S1008 in FIG. 5) and the value of the second bit is set to "0" (step S1011 in FIG. 5). The band [8:0] is output as "1_0111_1111" in binary representation, that is, 383 in decimal representation (#A in FIG. 7).

Since updating of the band [8:0] is changed, it requires some time for the output of the DCO 105 to stabilize for a predetermined period. The period is "stabilization period" shown in FIG. 7. The time of the stabilization period is estimated roughly, and the not-shown main sequencer newly inputs the ABS_ON signal (#B in FIG. 7). It means start of the ABS process in the second bit in the band signal.

In the following, a process similar to that on the first bit of the band signal is performed. At #C in FIG. 7, the comparison result" in the ABS circuit 103 becomes "H" (Yes in step S1007 in FIG. 5). Accordingly, the value of the second bit is set to "0" (step S1009 in FIG. 5) and the value of the third bit is also changed to "0" (step S1011 in FIG. 5). As a result, the band [8:0] is output as "1_0011_1111" in binary representation, that is, 319 in decimal representation (#C in FIG. 7).

Hereinafter, the process on the ABS_ON signal is executed seven times (total nine times). By performing the process in such a manner, regardless of the DCO set frequency, an error of the ABS can be reduced to the minimum value.

An effect of the embodiment is that the process time in S1005 can be shortened. That is, by subtracting the initial phase difference, the differential value between the DIV signal and the REF signal can be made closer to the real value. As a result, the number of frequency division times can be estimated to be smaller, and the "reference time" in S1005 to be assumed can be made a smaller value. It can shorten the rising period of the ABS_ON signal and, further, the process time of the ABS operation itself can be shortened.

As understood from the above, the difference between the DIV signal and the REF signal is stored at each rising edge of the ABS_ON signal (step S1004 in FIG. 5). Since the initial phase difference can be cancelled at each input of the ABS_ON signal, which is performed total nine times, the phase difference is not accumulated. As a result, early stabilization of the frequency of the DCO 105 can be realized.

Second Embodiment

Next, a second embodiment of the invention will be described.

In the first embodiment, while the difference between the DIV signal and the REF signal is small, operation is performed without any problem.

However, in the case where the DIV signal is largely deviated from the REF signal as a target frequency, saturation occurs before sufficient comparison is carried out, and the precision of ABS deteriorates.

In the embodiment, a hybrid mode with analog ABS is proposed.

Figure 8:
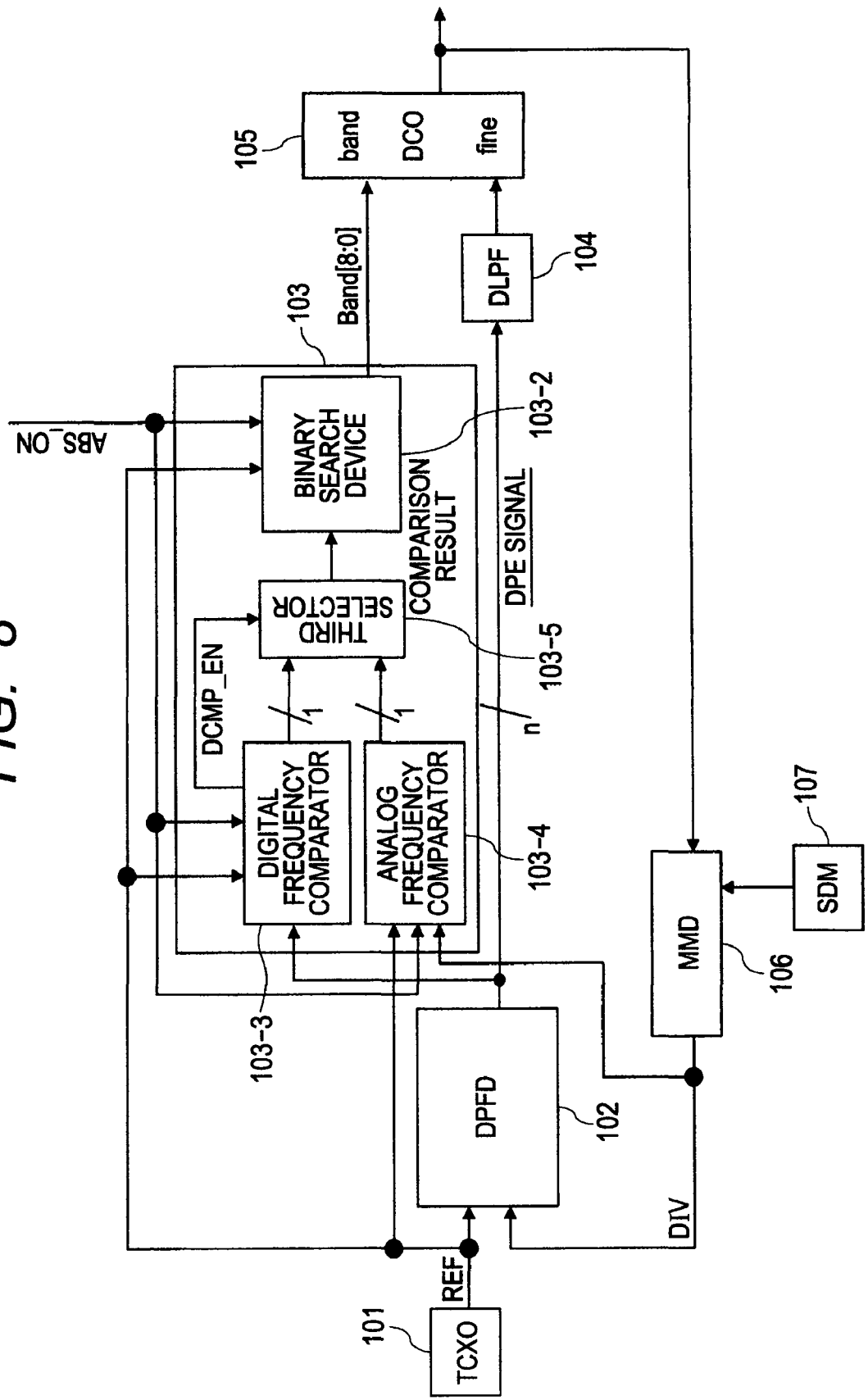
FIG. 8 is a block diagram expressing the configuration of an ADPLL circuit for a cellular phone related to a second embodiment of the invention.

FIG. 8 is a block diagram expressing the configuration of the ADPLL circuit for a cellular phone related to the second embodiment of the invention.

The different point from the first embodiment is mainly the configuration of the ABS circuit 103.

The ABS circuit 103 in the second embodiment includes a digital frequency comparator 103-3, the binary search device 103-2, an analog frequency comparator 103-4, and a third selector 103-5. Since the binary search device 103-2 is similar to that of the first embodiment, the description will not be repeated.

Figure 9:
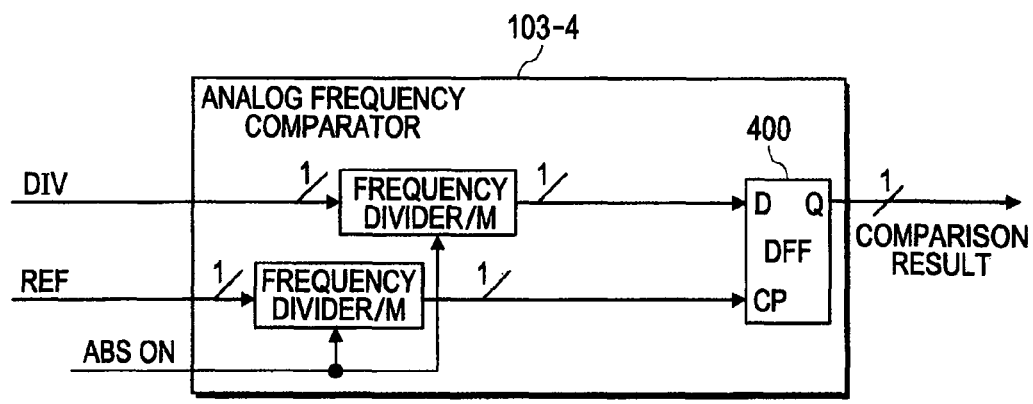
FIG. 9 is a block diagram showing the configuration of an analog frequency comparator related to the second embodiment of the invention.

The analog frequency comparator 103-4 is a general analog frequency comparator to which the DIV signal and the REF signal to be compared are directly input. FIG. 9 is a block diagram showing the configuration of the analog frequency comparator 103-4 related to the second embodiment.

As obvious from the diagram, the DIV signal and the REF signal are divided by the same frequency division ratio. After that, a signal obtained by dividing the frequency of the DIV signal is input to a data terminal of a DFF 400 in the analog frequency comparator 103-4, and a signal obtained by dividing the frequency of the REF signal is input to a timing terminal. In the case where the DIV signal is ahead of the REF signal, "1" is output as a comparison result. In the other case, "0" is output as a comparison result.

Figure 10:
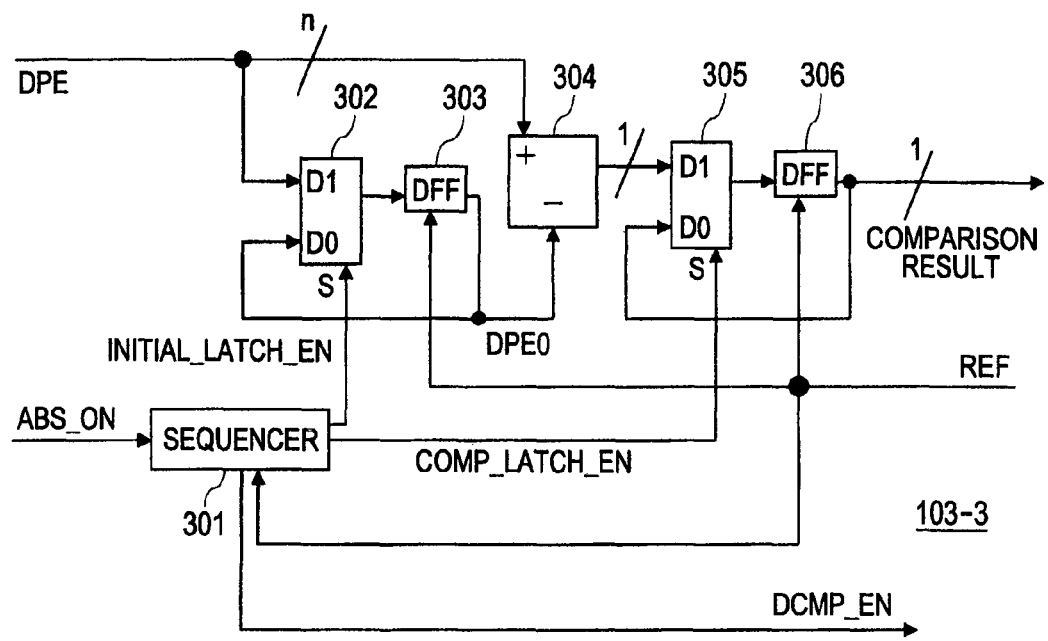
FIG. 10 is a block diagram showing the configuration of a digital frequency comparator related to the second embodiment of the invention.
Figure 11:
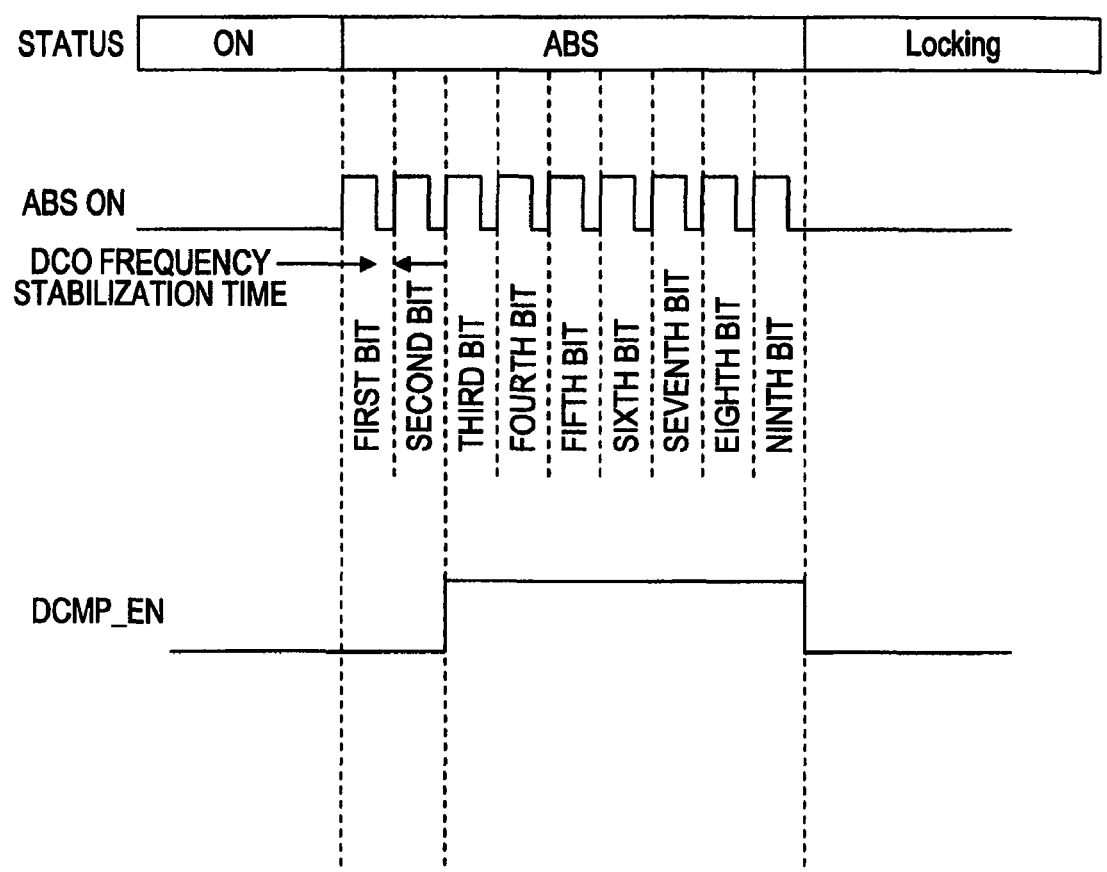
FIG. 11 is a timing chart showing waveform of a DCMP_EN signal output from the digital frequency comparator related to the second embodiment of the invention.

FIG. 10 is a block diagram showing the configuration of the digital frequency comparator 103-3 related to the second embodiment of the invention. FIG. 11 is a timing chart showing waveform of a DCMP_EN signal output from the digital frequency comparator 103-3 related to the second embodiment of the invention.

The basic configuration of the digital frequency comparator 103-3 is the same as that of the first embodiment. As an output signal line from the sequencer 301, one DCMP_EN signal is added.

The DCMP_EN signal is input to the third selector 103-5. The DCMP_EN signal is interlocked with the variable "j" in the first embodiment. The third selector 103-5 outputs the comparison result of the analog frequency comparator 103-3 to the binary search device 103-2 until "j" becomes "3" in step S1005 in FIG. 5. On the other hand, after "j" becomes "3" (or after the rising edge of the ABS_ON signal for making "j" equal to 3), the third selector 103-5 outputs an output of the digital frequency comparator 103-1 to the binary search device 103-2.

FIG. 11 shows the operation. The "status" and "ABS_ON" at the upper stages in FIG. 11 are similar to those in FIG. 3. Consequently, the waveforms of the DCMP_EN signal are as shown in FIG. 11.

By the operation, in a period between the first and second bits of the ABS_ON signal, that is, a period in which the frequency fluctuates most largely, the output of the analog frequency comparator 103-4 is switched. After the third bit, the output of the digital frequency comparator 103-3 is switched.

The invention achieved by the inventors herein has been concretely described above on the basis of the embodiments. Obviously, the invention, however, is not limited to the foregoing embodiment but can be variously modified without departing from the gist.

The present invention is directed to shorten the ABS process period immediately after startup or the like. Particularly, application to a portable information device such as a cellular phone is considered. Specifically, the invention can be applied to a plurality of frequency bands (so-called dual band and tri-band). However, the invention is not limited to the application.

For example, the invention can be properly applied to an electronic device which requires automatic adjustment of frequency by applying the ABS process of the present invention at the time of changing the rotary speed of an optical disk drive or the like.

What is claimed is:

1. An ADPLL circuit comprising:
   a digitally controlled oscillator;
   a digital phase comparator for detecting a phase error between a frequency division signal obtained by dividing frequency of an output of the digitally controlled oscillator and a reference signal; and
   an ABS circuit for performing automatic frequency selection,
   wherein the ABS circuit has therein a digital frequency comparator for detecting a shift direction of a phase error between the frequency division signal and the reference signal from an output of the digital frequency comparator, and
   wherein the digital frequency comparator includes a first D-flip flop for storing a shift amount of the phase error between the frequency division signal and the reference signal in beginning of start of the ABS operation of the digital phase comparator.

2. The ADPLL circuit according to claim 1, wherein the digital frequency comparator comprises a subtractor for subtracting the shift amount of the phase error stored in the first D-flip flop from an output of the digital phase comparator which is input.

3. The ADPLL circuit according to claim 2, wherein the digital frequency comparator detects a shift direction of the phase error by using sign of a value obtained by subtracting the shift amount of the phase error stored in the first D-flip flop from the output of the digital phase comparator.

4. The ADPLL circuit according to claim 3,
   wherein the ABS circuit further comprises a binary search device,
   wherein a band signal configured by two or more signal lines is output from the binary search device, and
   wherein a value of any one of the signal lines of the band signal is determined by supplying a shift direction of the phase error from the digital frequency comparator to the binary search device.

5. The ADPLL circuit according to claim 4, further comprising a digital low-pass filter,
   wherein the band signal and an output of the digital phase comparator via the digital low-pass filter are input to the digitally controlled oscillator.

6. The ADPLL circuit according to claim 4, further comprising an analog phase comparator and a selector circuit,
   wherein the selector circuit selects which one of an output of the digital phase comparator and an output of the analog phase comparator is input to the binary search device.

7. A semiconductor device comprising the ADPLL circuit according to claim 1.

8. A portable information device comprising the semiconductor device according to claim 7.

9. A semiconductor device comprising the ADPLL circuit according to claim 2.

10. A semiconductor device comprising the ADPLL circuit according to claim 3.

11. A semiconductor device comprising the ADPLL circuit according to claim 4.

12. A semiconductor device comprising the ADPLL circuit according to claim 5.

13. A semiconductor device comprising the ADPLL circuit according to claim 6.

* * * * *